(12) United States Patent
Zhou et al.

(10) Patent No.: US 9,812,498 B2
(45) Date of Patent: Nov. 7, 2017

(54) SEMICONDUCTOR DEVICE

(71) Applicant: TOSHIBA MEMORY CORPORATION, Minato-ku, Tokyo (JP)

(72) Inventors: Jieyun Zhou, Fujisawa Kanagawa (JP); Shinichiro Shiratake, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/220,805

(22) Filed: Jul. 27, 2016

(65) Prior Publication Data

US 2017/0236867 A1 Aug. 17, 2017

Related U.S. Application Data

(60) Provisional application No. 62/294,704, filed on Feb. 12, 2016.

(51) Int. Cl.
*G11C 11/00* (2006.01)
*H01L 27/22* (2006.01)
*H01L 43/08* (2006.01)
*G11C 11/16* (2006.01)

(52) U.S. Cl.
CPC ........ *H01L 27/228* (2013.01); *G11C 11/1657* (2013.01); *G11C 11/1673* (2013.01); *G11C 11/1697* (2013.01); *H01L 43/08* (2013.01)

(58) Field of Classification Search
CPC ... G11C 14/009; G11C 13/00–13/0011; G11C 13/0002; G11C 13/0004; G11C 13/0007; G11C 13/0009

USPC ................................. 365/148, 158, 171, 173
See application file for complete search history.

(56) References Cited

U.S. PATENT DOCUMENTS

| 2009/0268509 | A1 | 10/2009 | Maejima |
| 2009/0296452 | A1 | 12/2009 | Tonomura |
| 2011/0075469 | A1* | 3/2011 | Wei ..................... G11C 11/5685 365/148 |
| 2013/0258752 | A1* | 10/2013 | Park ................... G11C 13/0002 365/148 |
| 2014/0332752 | A1* | 11/2014 | Kouno ............... G11C 13/0004 257/5 |

FOREIGN PATENT DOCUMENTS

JP 2012027974 A 2/2012

* cited by examiner

*Primary Examiner* — Han Yang
(74) *Attorney, Agent, or Firm* — Holtz, Holtz & Volek PC

(57) ABSTRACT

According to one embodiment, a semiconductor device includes a variable resistance circuit having first and second resistance elements connected in series, first and second switch elements connected in parallel with the first resistance element, and third and fourth switch elements connected in parallel with the second resistance element. In a case where the first resistance element is short-circuited, and the second resistance element is not short-circuited, one of the first and second switch elements is turned ON. In a case where the second resistance element is short-circuited, and the first resistance element is not short-circuited, one of the third and fourth switch elements is turned ON. In a case where the first and second resistance elements are short-circuited, the first to fourth switch elements are turned ON.

20 Claims, 13 Drawing Sheets

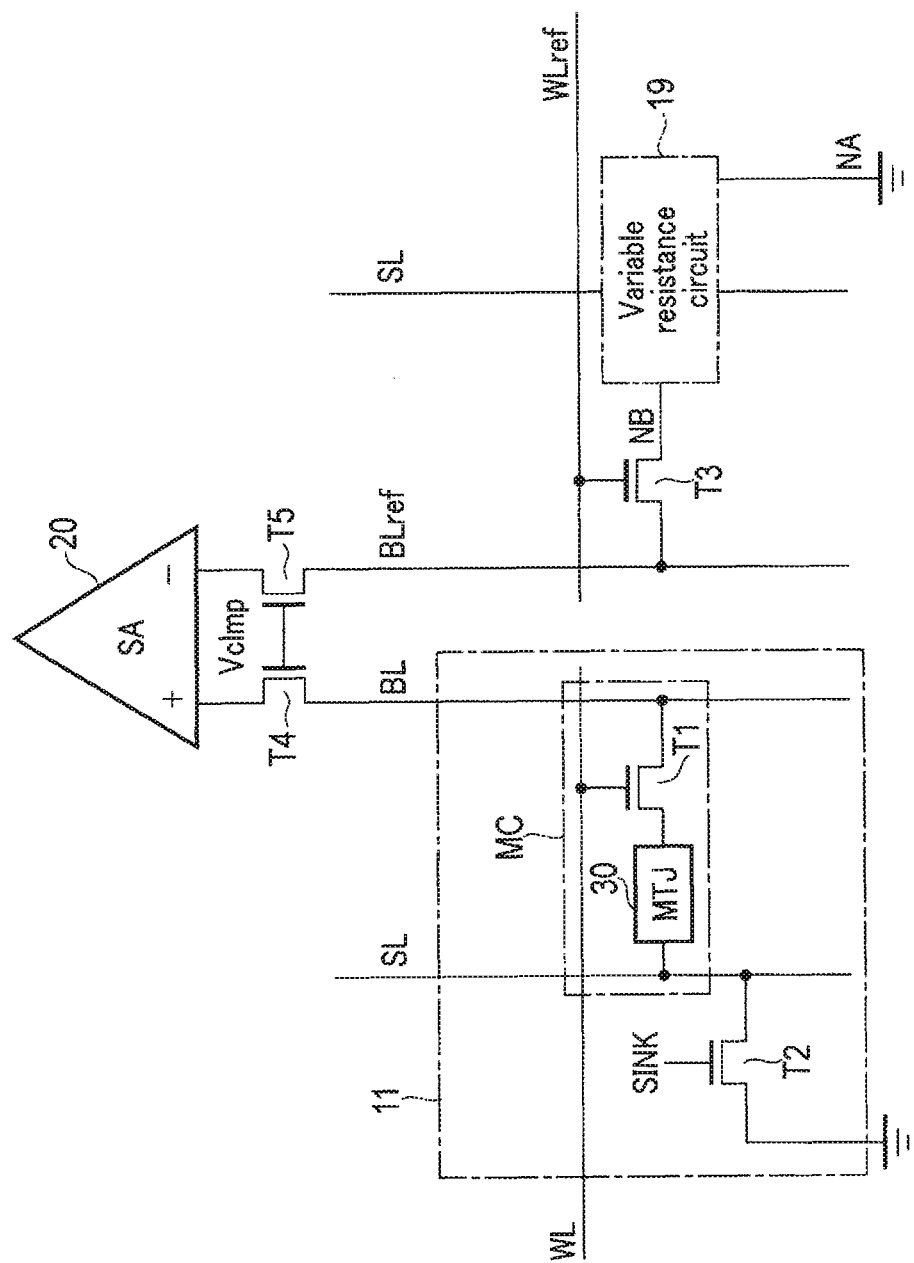
F I G. 2

| Resistance | | S1 | S2 | S3 | S4 |
|---|---|---|---|---|---|
| | | 1R | 2R | 4R | 8R |
| 0R | 0R | 0 | 0 | 0 | 0 |
| 1R | 1R | 1 | 0 | 0 | 0 |
| 2R | 2R | 0 | 1 | 0 | 0 |
| 3R | 3R=1R+2R | 1 | 1 | 0 | 0 |
| 4R | 4R | 0 | 0 | 1 | 0 |
| 5R | 5R=1R+4R | 1 | 0 | 1 | 0 |
| 6R | 6R=2R+4R | 0 | 1 | 1 | 0 |
| 7R | 7R=1R+2R+4R | 1 | 1 | 1 | 0 |
| 8R | 8R | 0 | 0 | 0 | 1 |
| 9R | 9R=1R+8R | 1 | 0 | 0 | 1 |
| 10R | 10R=2R+8R | 0 | 1 | 0 | 1 |
| 11R | 11R=1R+2R+8R | 1 | 1 | 0 | 1 |
| 12R | 12R=4R+8R | 0 | 0 | 1 | 1 |
| 13R | 13R=1R+4R+8R | 1 | 0 | 1 | 1 |
| 14R | 14R=2R+4R+8R | 0 | 1 | 1 | 1 |
| 15R | 15R=1R+2R+4R+8R | 1 | 1 | 1 | 1 |

1; Resistance element selected
0; Resistance element unselected (Short-circuited)

FIG. 5

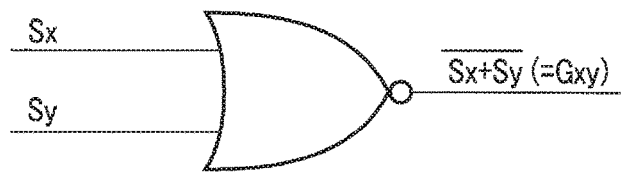

FIG. 6A

| | Column | 0 | 1 | 2 | 3 | 4 |
|---|---|---|---|---|---|---|
| Row | S signal | Sy | S1 | S2 | S3 | S4 |
| 0 | Sx | (VDD) | $G11=\overline{S1+S1}$ | $G22=\overline{S2+S2}$ | $G33=\overline{S3+S3}$ | $G44=\overline{S4+S4}$ |
| 1 | S1 | $G11=\overline{S1+S1}$ | $G11=\overline{S1+S1}$ | $G12=\overline{S1+S2}$ | $G13=\overline{S1+S3}$ | $G14=\overline{S1+S4}$ |
| 2 | S2 | $G22=\overline{S2+S2}$ | $G21=\overline{S1+S2}$ | $G22=\overline{S2+S2}$ | $G23=\overline{S2+S3}$ | $G24=\overline{S2+S4}$ |
| 3 | S3 | $G33=\overline{S3+S3}$ | $G31=\overline{S1+S3}$ | $G32=\overline{S2+S3}$ | $G33=\overline{S3+S3}$ | $G34=\overline{S3+S4}$ |
| 4 | S4 | $G44=\overline{S4+S4}$ | $G41=\overline{S1+S4}$ | $G42=\overline{S2+S4}$ | $G43=\overline{S3+S4}$ | $G44=\overline{S4+S4}$ |

FIG. 6B

| Resistance | | S1 | S2 | S3 | S4 |
|---|---|---|---|---|---|
| | | 1R | 2R | 4R | 8R |
| 0R | 0R | 1 | 1 | 1 | 1 |
| 1R | 1R | 0 | 1 | 1 | 1 |
| 2R | 2R | 1 | 0 | 1 | 1 |
| 3R | 3R=1R+2R | 0 | 0 | 1 | 1 |
| 4R | 4R | 1 | 1 | 0 | 1 |
| 5R | 5R=1R+4R | 0 | 1 | 0 | 1 |
| 6R | 6R=2R+4R | 1 | 0 | 0 | 1 |
| 7R | 7R=1R+2R+4R | 0 | 0 | 0 | 1 |
| 8R | 8R | 1 | 1 | 1 | 0 |
| 9R | 9R=1R+8R | 0 | 1 | 1 | 0 |
| 10R | 10R=2R+8R | 1 | 0 | 1 | 0 |
| 11R | 11R=1R+2R+8R | 0 | 0 | 1 | 0 |
| 12R | 12R=4R+8R | 1 | 1 | 0 | 0 |
| 13R | 13R=1R+4R+8R | 0 | 1 | 0 | 0 |
| 14R | 14R=2R+4R+8R | 1 | 0 | 0 | 0 |
| 15R | 15R=1R+2R+4R+8R | 0 | 0 | 0 | 0 |

1; Resistance element unselected
0; Resistance element selected

F I G. 11

| Column<br>Row | S signal | 0<br>Sy | 1<br>S1 | 2<br>S2 | 3<br>S3 | 4<br>S4 |
|---|---|---|---|---|---|---|
| 0 | Sx | (VDD) | G11=S1·S1 | G22=S2·S2 | G33=S3·S3 | G44=S4·S4 |
| 1 | S1 | G11=S1·S1 | G11=S1·S1 | G12=S1·S2 | G13=S1·S3 | G14=S1·S4 |
| 2 | S2 | G22=S2·S2 | G21=S1·S2 | G22=S2·S2 | G23=S2·S3 | G24=S2·S4 |
| 3 | S3 | G33=S3·S3 | G31=S1·S3 | G32=S2·S3 | G33=S3·S3 | G34=S3·S4 |
| 4 | S4 | G44=S4·S4 | G41=S1·S4 | G42=S2·S4 | G43=S3·S4 | G44=S4·S4 |

S<1:4>=1110
Rref=8R
| Row | Column<br>S signal | 0<br>Sy | 1<br>S1<br>1 | 2<br>S2<br>1 | 3<br>S3<br>1 | 4<br>S4<br>0 |
|---|---|---|---|---|---|---|
| 0 | Sx | 1(VDD) | 1 | 1 | 1 | 0 |
| 1 | S1 | 1 | 1 | 1 | 1 | 0 |
| 2 | S2 | 1 | 1 | 1 | 1 | 0 |
| 3 | S3 | 1 | 1 | 1 | 1 | 0 |
| 4 | S4 | 0 | 0 | 0 | 0 | 0 |
Gxy = "1"; switch Tr. ON
Gxy = "0"; switch Tr. OFF
F I G. 13
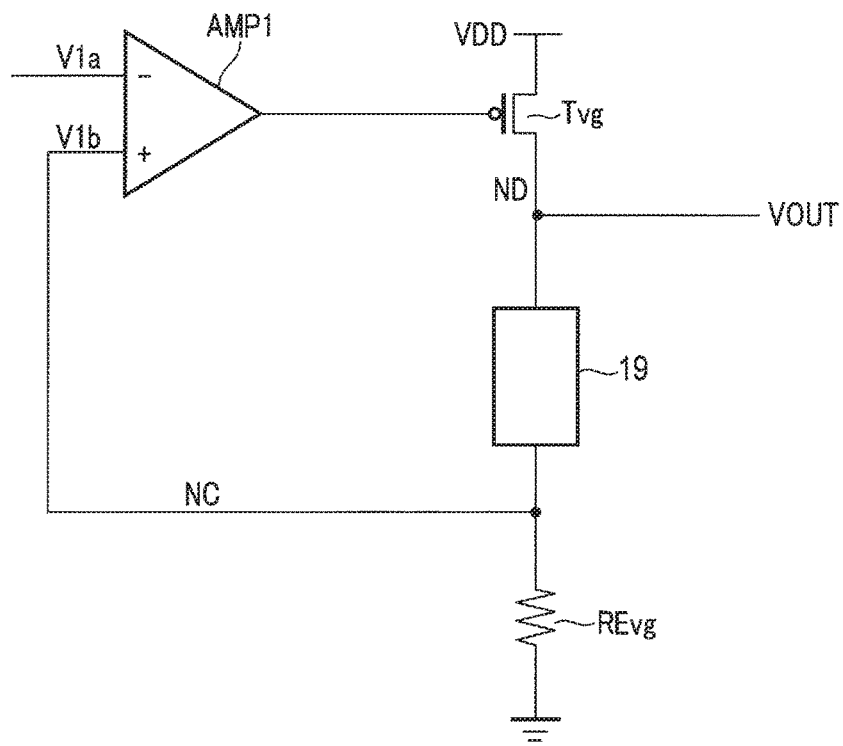
F I G. 14

SEMICONDUCTOR DEVICE

CROSS-REFERENCE TO RELATED APPLICATIONS

This application claims the benefit of U.S. Provisional Application No. 62/294,704, filed Feb. 12, 2016, the entire contents of which are incorporated herein by reference.

FIELD

Embodiments described herein relate generally to a semiconductor device.

BACKGROUND

Semiconductor storage devices having a resistance change type memory are known as a type of semiconductor device. Magnetoresistive random access memory (MRAM) is known as a type of resistance change type memory. An MRAM is a type of memory device adopting magnetic element in memory cell, and using magnetoresistance effect for information storage. An MRAM has attracted attention as next-generation memory devices achieving fast operation, large storage capacity, and non-volatility. Moreover, research and development for an MRAM as a replacement of a volatile memory, such as a DRAM and SRAM is advancing.

BRIEF DESCRIPTION OF THE DRAWINGS

FIG. 2 is a part of circuit diagram of a memory cell array in the semiconductor device according to the first embodiment.

FIG. 5 is a table illustrating the relationship between the logical values of control signals and combined resistance values of the resistance elements in the semiconductor device according to the first embodiment.

FIG. 6A is a logic calculation circuit by which control signals are synthesize from select signals (gate signals) Sx and Sy in the semiconductor device according to the first embodiment.

FIG. 6B illustrates the relationship between a gate signal and a control signal in the semiconductor device according to the first embodiment.

FIG. 11 is a table illustrating the relationship between the logical values of control signals and combined resistance values of the resistance elements in the semiconductor device according to the second embodiment.

FIG. 13 illustrates the relationship between a control signal and a gate signal in the semiconductor device according to the second embodiment.

FIG. 14 is a circuit diagram of an internal voltage generator in the semiconductor device according to the third embodiment.

DETAILED DESCRIPTION

In general, according to one embodiment, a semiconductor device includes a variable resistance circuit having first and second resistance elements connected in series, first and second switch elements each connected in parallel with the first resistance element, and third and fourth switch elements each connected in parallel with the second resistance element. In a case where the first resistance element is short-circuited, and the second resistance element is not short-circuited, one of the first and second switch elements is in an ON state and other of the first and second switch elements, the third switch element, and the fourth switch element are in an OFF state. In a case where the second resistance element is short-circuited, and the first resistance element is not short-circuited, one of the third and fourth switch elements is in the ON state and the first element, the second element, and other of the third and fourth switch elements are in the OFF state. In a case where the first and second resistance elements are short-circuited, the first to fourth switch elements are in the ON state. In a case where the first and second resistance elements are not short-circuited, the first to fourth switch elements are in the OFF state.

1. First Embodiment

A semiconductor device according to the first embodiment will be explained. In the first embodiment, an MRAM using a magnetic tunnel junction element (an MTJ element) for data storing is explained as an example. In the following explanation, the terms "connect" and "couple" should be construed as not only a direct connection, but also a physical or electrical connection through any intervening element, unless otherwise mentioned. In addition, one end of a transistor indicates either one of a source or a drain, and the other end indicates the other one of either the drain or the source.

1.1. Overall Configuration of Semiconductor Device

Figure 1:
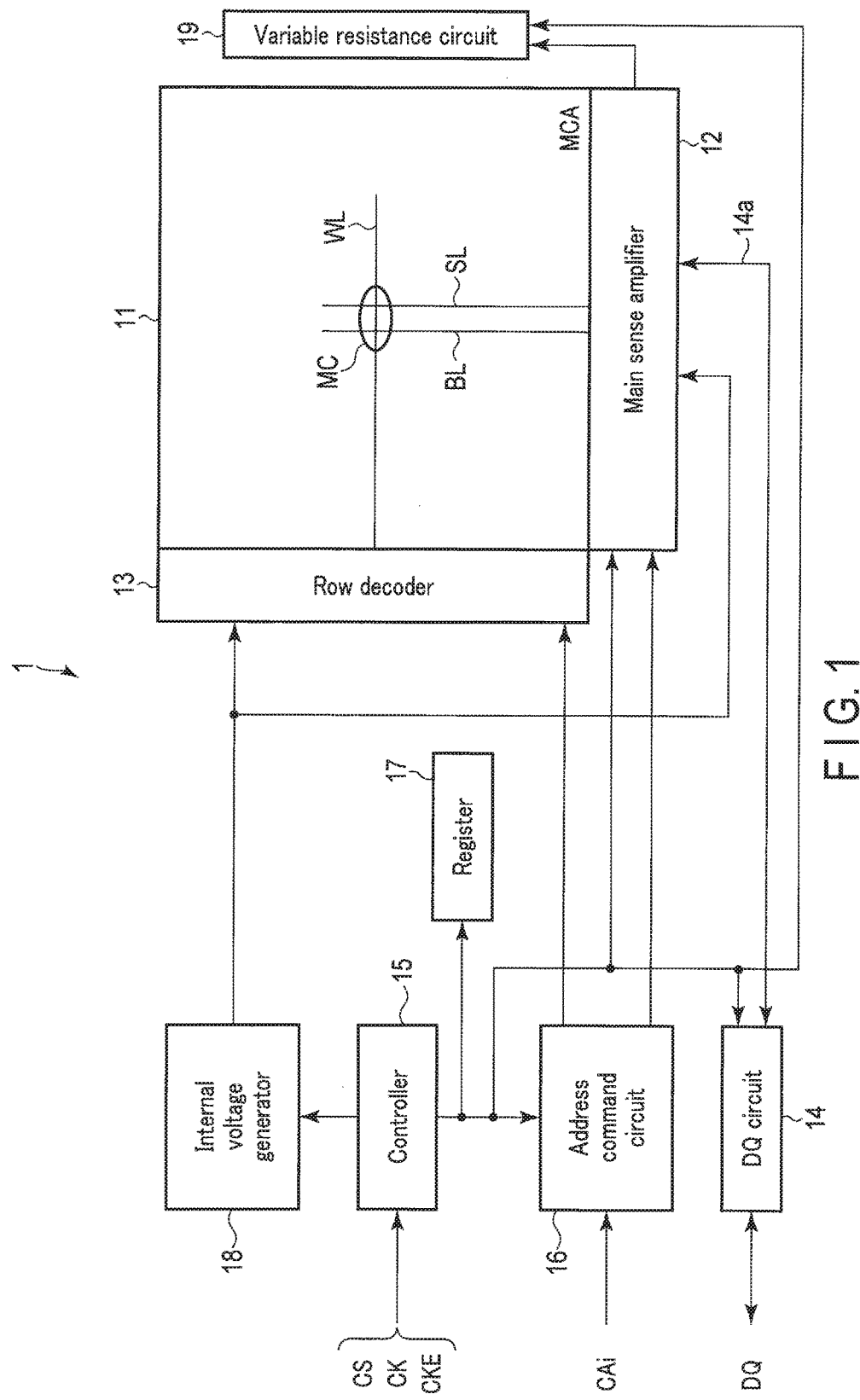
FIG. 1 is a block diagram of a semiconductor device according to the first embodiment.

To start, an overall configuration of the semiconductor device according to the present embodiment will be explained. FIG. 1 is a block diagram of a semiconductor device according to the first embodiment.

A semiconductor device 1 according to the embodiment includes a memory cell array (also referred to as "cell array") 11, a main sense amplifier 12, a row decoder 13, a DQ circuit 14, a bus (bus signal lines) 14a, a controller 15, an address command circuit 16, a register 17, an internal voltage generator 18, and a variable resistance circuit 19.

The memory cell array 11 including a plurality of memory cells are arranged in a two-dimensional matrix pattern. Specifically, a plurality of word lines WL are arranged in row direction, and a plurality of bit lines BL and a plurality of source lines SL are arranged in column direction. A memory cell MC is set at the intersection between a word line WL, a bit line, and a source line SL. The number of the memory cells is discretionary.

The memory cell MC includes, for example, a magnetic tunnel junction (MTJ) element (not shown in the drawings) as a memory element, and a cell transistor (not shown in the drawings). The MTJ element is an element which has resistance value varies with magnetization orientation by applying a necessary current (or voltage) in a certain direction. The memory element is not limited to an MTJ element, and may also be a phase change element or a ferroelectric element, for example.

The cell transistor is in an ON state when a memory cell MC is selected.

The main sense amplifier 12 firstly recognizes the command address signal CAi, which based on an external control signal, and then performs writing or reading data to or from the selected memory cell MC.

In addition, the main sense amplifier 12 includes a plurality of sense amplifier units (not shown in the drawings) corresponding to the bit lines BL. Each sense amplifier unit is connected to a bit line BL, and reads data from a selected memory cell MC which connected to the selected word line WL when a current flowing through the memory cell MC is detected. Each sense amplifier unit writes data in the memory cell MC connected to the selected word line by applying a current thereto.

The DQ circuit 14 performs receiving and transmitting data between an external input/output terminal DQ and the main sense amplifier 12 through the bus signal lines 14a.

The row decoder 13 decodes the address of the command address signal CAi which supplied from the address command circuit 16.

The row decoder 13 is connected to word lines WL and configured to apply a voltage to a selected word line WL when reading or writing data. Specifically, the row decoder 13 applies a voltage to the selected word line WL in accordance with the decoded row address.

The controller 15 receives various external control signals, such as a chip select signal CS, a clock signal CK, a clock enable signal CKE, etc. The controller 15 controls the address command circuit 16 and discriminates addresses and commands from each other.

The address command circuit 16 receives a command address signal CAi. The address command circuit 16 transfers the command address signal CAi to the row decoder 13 and the main sense amplifier 12.

The register 17 stores various settings used for the operation of the semiconductor device. The register 17 may consist of a volatile storage area, a nonvolatile storage area, or a fuse ROM.

The internal voltage generator 18 generates internal voltages (e.g., a boosted voltage higher than the power supply voltage) which are required for operations of the semiconductor device 1 based on control of the controller 15.

The variable resistance circuit 19 sets a resistance value (reference resistance Rref) required during reading operation, also based on control of the controller 15. The reference resistance Rref is set to be a middle value between a resistance value of MTJ element corresponding to data "1" (for example, high resistance state), and a resistance value of MTJ element corresponding to data "0" (for example, low resistance state).

1.1.1. Configuration of Memory Cell Array

Next, the configuration of the memory cell array 11 will be explained with reference to FIG. 2. As an example, FIG. 2 illustrates one memory cell MC among a plurality of memory cells MC arranged in a matrix pattern within the memory cell array 11.

FIG. 2 is the circuit diagram of the memory cell array in the semiconductor device according to the first embodiment.

As shown in FIG. 2, one of the input terminals (hereinafter referred to as "first input terminal") of a sense amplifier unit 20 is connected to one end of a clamp transistor T4, and the other input terminal (hereinafter referred to as "second input terminal") is connected to one end of a clamp transistor T5.

For example, the clamp transistors T4 and T5 are n-channel MOS transistors. The gates of the clamp transistors T4 and T5 are connected together, and a clamp signal Vclmp is applied to gates of T4 and T5. The other end of the clamp transistor T4 is connected to a bit line BL, and the other end of the clamp transistor T5 is connected to a reference bit line BLref. The clamp transistors T4 and T5 each clamp a voltage applied to the bit line BL or the reference bit line BLref to a voltage according to a voltage of the clamp signal Vclmp (a voltage value obtained by subtracting the threshold voltage Vth of the clamp transistors T4 and T5 from a clamp voltage Vclmp).

The memory cell array 11 includes a memory cell MC and a sink transistor T2. The sink transistor T2 is, for example, an n-channel MOS transistor.

The memory cell MC includes an MTJ element 30 and a cell transistor T1. The cell transistor T1 is, for example, an n-channel MOS transistor. One end of the MTJ element 30 is connected to one end of the cell transistor T1, and the other end of the MTJ element 30 is connected to a source line SL. The other end of the cell transistor T1 is connected to a bit line BL, and the gate thereof is connected to a word line WL. In the memory cell array 11, the gates of the cell transistors T1 arranged in the same row are connected together to the same word line WL, and the cell transistors T1 arranged in the same column are connected together to the same bit lines BL. The MTJ elements 30 arranged in the same column are connected together to the same source lines SL.

The sink transistor T2 grounds a source line SL allowing a current to flow through the source line SL, the target memory cell MC to a bit line BL in the reading operation. One end of the sink transistor T2 is connected to a source line SL, and the other end thereof is grounded (connected to a ground voltage line). A signal SINK is input to the gate of the sink transistor T2.

One end of the variable resistance circuit 19 is connected to the reference bit line BLref through a node NB and the cell transistor T3, and the other end thereof is grounded through a node NA. The variable resistance circuit 19 is connected to the source line SL.

One end of the cell transistor T3 is connected to the variable resistance circuit 19 through the node NB, the other end thereof is connected to the reference bit line BLref, and the gate thereof is connected to the reference word line WLref. The cell transistor T3 is, for example, an n-channel MOS transistor. For example, a "high" level voltage is applied to a selected word line WL and the reference word line WLref during the reading operation. Therefore, the cell transistor T1 of the selected memory cell MC and the cell transistor T3 connected to the corresponding variable resistance circuit 19 are turned on. The cell transistor T3 is preferably the same as the cell transistor T1 in size (specifically gate length x and gate width), thickness of gate oxide film, polarity, and property (ON-resistance), so that the variance (as well as the driving capability) due to the operating environment (applied voltage, temperature, etc.) are equalized.

1.1.2. Configuration of MTJ Element

The MTJ element 30 will be explained with reference to FIGS. 3A and 3B.

Figure 3A:
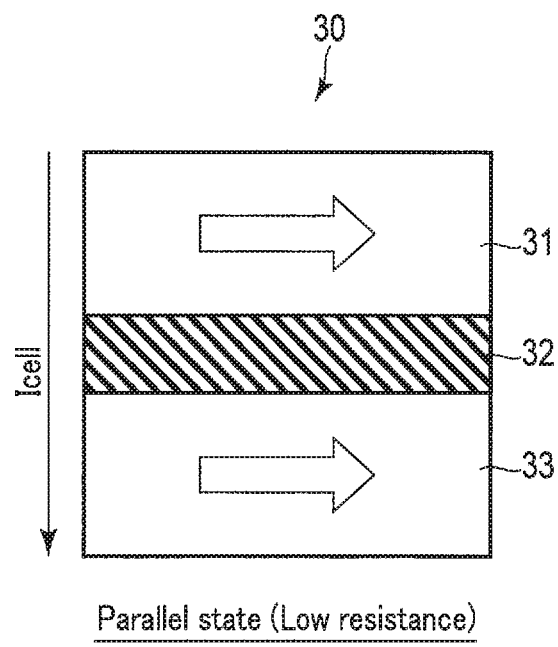
FIG. 3A is a cross-sectional view of an MTJ element in which magnetizations are in a parallel orientation (low resistance state) in the semiconductor device according to the first embodiment.

FIG. 3A is a cross-sectional view of the MTJ element in which magnetizations are in a parallel orientation (low resistance state) in the semiconductor device according to the first embodiment.

Figure 3B:
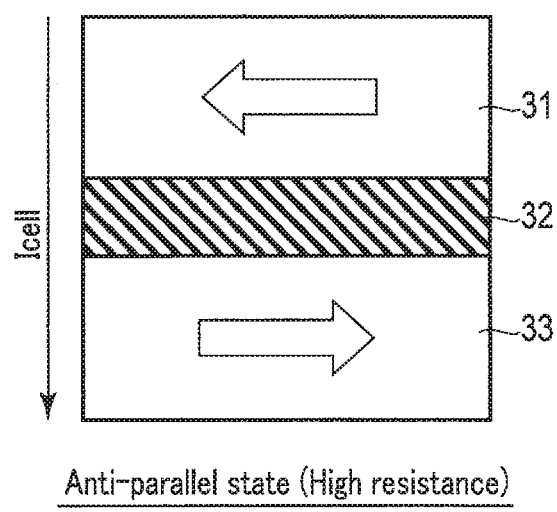
FIG. 3B is a cross-sectional view of an MTJ element in which magnetizations in an anti-parallel orientation (high resistance state) in the semiconductor device according to the first embodiment.

FIG. 3B is a cross-sectional view of the MTJ element in which magnetizations are in an anti-parallel orientation (high resistance state) in the semiconductor device according to the first embodiment.

As shown in FIGS. 3A and 3B, the MTJ element 30 includes a storage layer (free layer) 31, a tunnel barrier layer 32, and a reference layer 33.

The storage layer 31 is a ferromagnetic layer in which the magnetization direction (spin direction) is variable; the magnetization direction varies in accordance with write current direction and absolute value. The storage layer 31 is made of CoPd (cobalt palladium), CoFeB (cobalt iron boron), or FeB (iron boron), for example. As shown in FIG. 3A, when the magnetization direction of the storage layer 31 and the magnetization direction of the reference layer 33 are parallel, the resistance value of the MTJ element 30 becomes minimum (a low resistance state). This case is defined as data "0", for example.

As shown in FIG. 3B, when the magnetization direction of the storage layer 31 and the magnetization direction of the reference layer 33 are anti-parallel, the resistance value of the MTJ element 30 becomes maximum (a high resistance state). This case is defined as data "1", for example.

The reference layer 33 is a ferromagnetic layer in which a magnetization direction (direction of spin) is fixed in spite of current direction and absolute value. In other words, the reference layer 33 has a greater inverted energy barrier of the magnetization direction than the storage layer 31 has. The reference layer 33 is made of CoPt (cobalt platinum), CoNi (cobalt nickel), or CoPd (cobalt palladium), for example. Note that the magnetization direction of the storage layer 31 and the magnetization direction of the reference layer 33 are not limited to being perpendicular to the direction of current flow; parallel direction is also available.

The tunnel barrier layer 32 is provided between the storage layer 31 and the reference layer 33. The tunnel barrier layer 32 is a non-magnetic layer, and is made of MgO, for example.

For example, when reading data from the memory cell MC, the sense amplifier unit 20 supplies a cell current Icell to the MTJ element 30. This cell current Icell is set to a value below which the magnetization direction of the storage layer 31 does not invert (i.e., a value smaller than a write current). The sense amplifier unit 20 reads the data "0" and data "1" by detecting a resistance value of the MTJ element 30 through write current.

Note that, in the present embodiment, the composition ratio of the above materials (MgO, CoFeB, CoPd, FeB, CoPt, and CoNi) are not limited to 1:1 or 1:1:1. For example, in a case where the storage layer 31 is made of CoFeB, the storage layer 31 contains Co, Fe, and B, and the composition ratio of Co, Fe, and B is not limited. For example, in a case where the tunnel barrier layer 32 is made of MgO, the tunnel barrier layer 32 contains Mg and O, and the composition ratio of Mg and O is not limited.

1.1.4. Configuration of Variable Resistance Circuit

Figure 4:
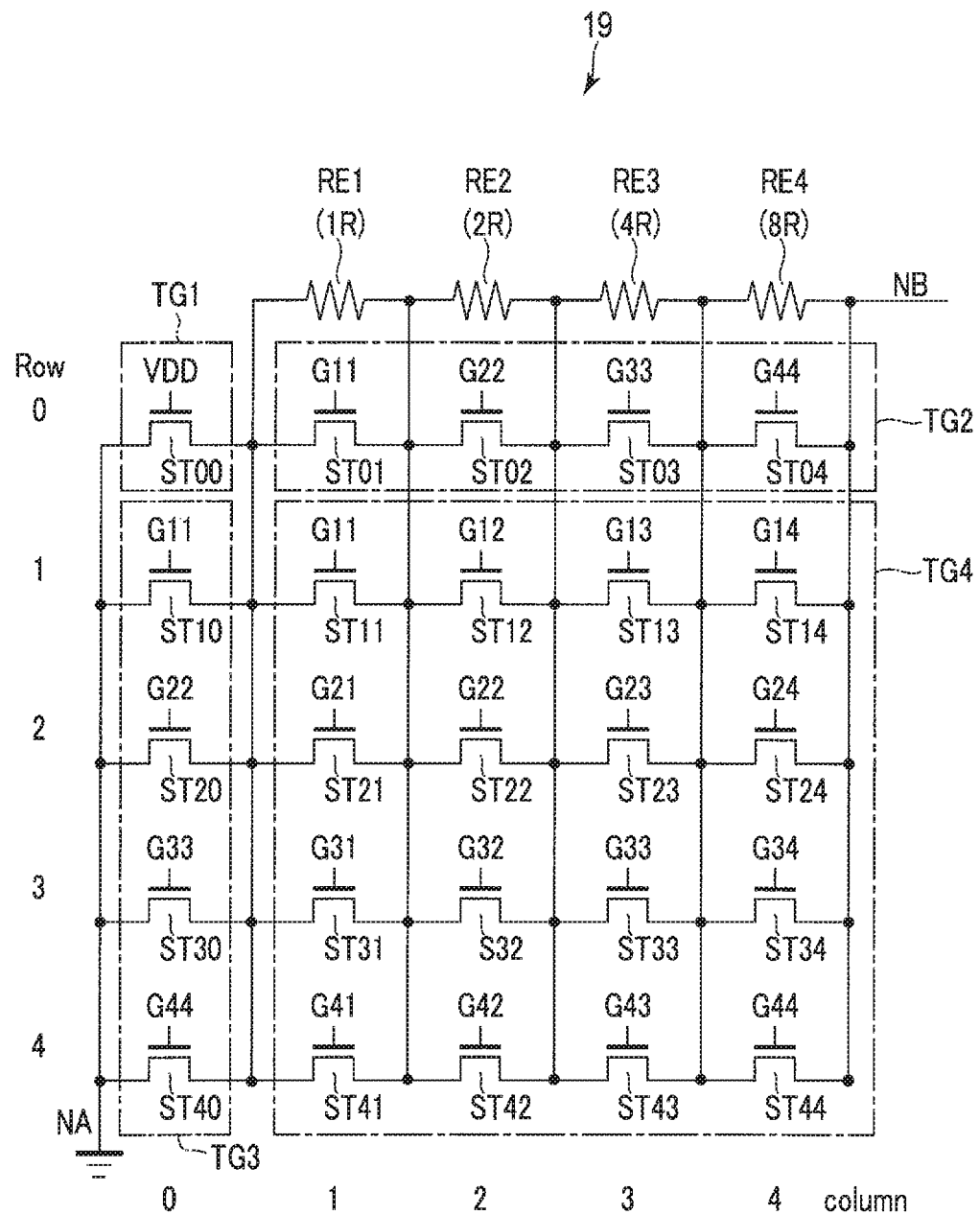
FIG. 4 is a circuit diagram of a variable resistance circuit in the semiconductor device according to the first embodiment.

The variable resistance circuit 19 will be explained with reference to FIG. 4. FIG. 4 illustrates the variable resistance circuit 19 in which a resistance value can be adjusted to a value from 1R (R is any resistance value) to 15 times of R, as an example.

FIG. 4 is a circuit diagram of the variable resistance circuit in the semiconductor device according to the first embodiment.

As shown in FIG. 4, the variable resistance circuit 19 includes four resistance elements RE1 to RE4 having different resistance value for each, and twenty five switch transistors STab (a is any row number from 0 to 4, and b is any column number from 0 to 4) connected in a 5 row×5 column matrix pattern. Specifically, twenty five switch transistors are set as ST00 to ST04 for first row, ST10 to ST14 for 2nd row, ST20 to ST24 for 3nd row, ST30 to ST34 for 4th row, and ST40 to ST44 for 5th row. Hereinafter, referred to as "a switch transistor ST" when not limited to a certain switch transistor, and referred to as "a resistance element RE" when not limited to a certain resistance element. A switch transistor ST is, for example, an n-channel MOS transistor. A switch transistor ST may be an n-channel MOS transistor, a p-channel MOS transistor, or a combination of an n-channel MOS transistor and a p-channel MOS transistor.

A resistance element RE is a polysilicon resistance element using a semiconductor layer (or referred to as polysilicon layer) formed upon an insulation layer on a semiconductor substrate as a resistance, for example. The resistance value of the resistance element may be set by adjusting the n-type impurity concentration of P (phosphorus) or As (arsenic), etc. injected to polysilicon or adjusting the size of polysilicon (width, length, and thickness). Furthermore, the temperature dependency of a polysilicon resistance element may change by adjusting the impurity concentration. Accordingly, the temperature dependency of resistance value can be closer to the MTJ element 30.

The resistance element RE is not limited to a certain polysilicon resistance element. For example, a diffusion layer resistance which uses a diffusion layer formed by injecting n-type impurities to a semiconductor substrate (p-type semiconductor substrate) as a resistance element may be applied. In this case, the resistance value of the resistance element RE may be adjusted by adjusting the processing condition (the amount of impurities to be injected, the depth of injection, or heat processing temperature, etc.), the width, or the length of diffusion layer. In addition, the temperature dependency of the resistance element RE may change by adjusting the impurity concentration. Furthermore, an MTJ element may be used as the resistance element RE. In this case, the temperature dependency of the resistance value can be equal to cell by using the same MTJ element which is also used for the memory cell MC. Furthermore, a ferroelectric element may be used as the resistance element RE.

The four resistance elements RE1 to RE4 are connected in series. One end of the resistance RE4 is connected to the node NB. The resistance value of the resistance elements RE1 to RE4 is the power function of 2, for example. Specifically, if the resistance value of the resistance element RE1 is R, the resistance value of the resistance element RE2 is $2^1$, which is 2R. Similarly, the resistance value of the resistance element RE3 is $2^2$, which is 4R, and the resistance value of the resistance element RE4 is $2^3$, which is 8R. That is, if n resistance elements REn (n is any natural number) are connected in series, the resistance value of n-th resistance element REn is $2^{(n-1)}$ times of R.

For example, the controller 15 transmits a 4-bit control signal S<1:4> (S1, S2, S3, and S4) corresponding to the resistance elements RE1 to RE4 to the variable resistance circuit 19. The variable resistance circuit 19 uses the plurality of switch transistors ST and selectively short-circuits the four resistance elements RE1 to RE4 connected in series, in accordance with the control signal S<1:4> to synthesis the resistance values 1R to 15R. The number of the resistance elements RE is not limited to four, and is OK with 2 or larger than 2.

When the four resistance elements are connected in series, the switch transistors ST are arranged in a (4+1) row×(4+1) column matrix pattern. That is, $(n+1)^2$ switch transistors ST are arranged with respect to n resistance elements. The gate of each switch transistor ST receives a gate signal Gxy synthesized by a control signal Sx of x-th bit (x is a natural number from 1 to 4) of the control signal S<1:4> and a control signal Sy of y-th bit (y is a natural number from 1 to 4) of the control signal S<1:4> (described later). It is preferable that each switch transistor ST is activated in a linear area, and has the same polarity, transistor size, and property (ON-resistance). In addition, the switch transistors ST are preferably the same as the sink transistor T2 in polarity, transistor size, thickness of gate oxide film, and property (ON-resistance), so as to reduce the difference between the dependency of the cell current Icell and the reference current Iref relative to the operating environment (applied voltage, temperature, etc.).

The connection between each switch transistor ST will be explained in detail.

As shown in FIG. 4, five switch transistors named as ST00, ST10, ST20, ST30 and ST40 in column 0 (column 0, i.e., b=0) are arranged in parallel between a node NA and one end of the resistance element RE1. The switch transistor ST00 in row 0 (row 0, i.e., a=0) receives a voltage VDD at the gate, and is in the ON state. The switch transistors ST10, ST20, ST30, and ST40 in row 1 to row 4 (row 1 to 4, i.e., a=1 to 4) respectively receive gate signals G11, G22, G33, and G44 at the gate. That is, the switch transistors ST00, ST10, ST20, ST30, and ST40 form a circuit that controls connection between the node NA and the resistance element RE1.

Five switch transistors ST01, ST11, ST21, ST31, and ST41 in column 1 (column 1, i.e., b=1) are arranged in parallel between one end of the resistance element RE1 and the other end of the resistance element RE1. The switch transistors ST01, ST11, ST21, ST31, and ST41 respectively receive gate signals G11, G11, G21, G31, and G41 at the gate. That is, the switch transistors ST01, ST11, ST21, ST31, and ST41 form a circuit that short-circuits the resistance element RE1.

Five switch transistors ST02, ST12, ST22, ST32, and ST42 in column 2 (column 2, i.e., b=2) are arranged in parallel between one end of the resistance element RE2 and the other end of the resistance element RE2. The switch transistors ST02, ST12, ST22, ST32, and ST42 respectively receive gate signals G22, G12, G22, G32, and G42 at the gate. That is, the switch transistors ST02, ST12, ST22, ST32, and ST42 form a circuit that short-circuits the resistance element RE2.

Five switch transistors ST03, ST13, ST23, ST33, and ST43 in column 3 (column 3, i.e., b=3) are arranged in parallel between one end of the resistance element RE3 and the other end of the resistance element RE3. The switch transistors ST03, ST13, ST23, ST33, and ST43 respectively receive gate signals G33, G13, G23, G33, and G43 at the gate. That is, the switch transistors ST03, ST13, ST23, ST33, and ST43 form a circuit that short-circuits the resistance element RE3.

Five switch transistors ST04, ST14, ST24, ST34, and ST44 in column 4 (column 4, i.e., b=4) are arranged in parallel between one end of the resistance element RE4 and the other end of the resistance element RE4. The switch transistors ST04, ST14, ST24, ST34, and ST44 respectively receive gate signals G44, G14, G24, G34, and G44 at the gate. That is, the switch transistors ST04, ST14, ST24, ST34, and ST44 form a circuit that short-circuits the resistance element RE4.

Next, the relationship between the arrangement of switch transistors ST and the gate signal Gxy in the matrix pattern will be explained.

The switch transistors ST in (4+1) row×(4+1) column are divided into four groups in accordance with the gate signal Gxy to be input to the gate. The switch transistor ST00 in row 0 and column 0 (a=b=0) is classified as transistor group TG1, and the switch transistors (ST01, ST02, ST03, and ST04) except the switch transistor ST00 in row 0 (a=0, b=1 to 4), are classified as transistor group TG2. The switch transistors (ST10, ST20, ST30, and ST40) except the switch transistor ST00 in column 0 (a=1 to 4, b=0) are classified as transistor group TG3, and the other switch transistors (ST11 to ST44) are classified as transistor group TG4.

VDD is applied to the gate of transistor group TG1 (i.e., the switch transistor ST00) regardless of the control signal S<1:4>.

A gate signal Gxy=Gxx=Gyy (G11, G22, G33, and G44) corresponding to the resistance element REn connected in parallel is synthesized by control signals Sx and Sy (x=y=n), and this gate signal is input to the gate of each switch transistor ST of the transistor group TG2. Specifically, a gate signal Gnn is input to the switch transistor ST0n (a=0, b=n=1 to 4) corresponding to the resistance element REn.

The transistor group TG3 is set as the transposed matrix of the transistor group TG2. A gate signal Gxy=Gxx=Gyy (G11, G22, G33, and G44) are similarly input to the gate of each switch transistor ST of the transistor group TG3. Specifically, a gate signal Gnn is input to the switch transistor STn0 (a=n=1 to 4, b=0).

In the transistor group TG4, a variable x of the gate signal Gxy corresponds to the row number a, and a variable y corresponds to the column number b. Specifically, a gate signal Gxy is input to the gate of the switch transistor STxy (a=x=1 to 4, b=y=1 to 4). For example, a gate signal G11 is input to the gate of the switch transistor ST11 in row 1 and column 1 (a=b=1), and a gate signal G34 is input to the gate of the switch transistor ST34 in row 3, column 4 (a=3, b=4).

1.2. Configuration of Variable Resistance Circuit

The relationship between the control signal S<1:4> to be input to the variable resistance circuit 19 and the gate signal Gxy synthesized based on the control signal S <1:4> will be explained.

1.2.1. Combination of Control Signals

Firstly, a four-bit control signal S<1:4> will be explained in detail with reference to FIG. 5.

FIG. 5 is a table illustrating the relationship between a control signal and a synthesized resistance value of the resistance elements in the semiconductor device according to the first embodiment.

As shown in FIG. 5, the variable resistance circuit 19 according to the present embodiment combines the resistance values of 0R to 15R by selectively short-circuiting the four resistance elements RE1 to RE4 in accordance with the control signal S<1:4>. In the example shown in FIG. 5, the control signals S1 to S4 respectively correspond to the resistance elements RE1 (1R) to RE4 (8R). Data "1" indicates the case when a corresponding resistance element RE is selected, i.e., the corresponding switch transistor ST is in an OFF state (open state). Data "0" indicates the case when a corresponding resistance element RE is not selected (short-circuited), i.e., the corresponding switch transistor ST is in the ON state (short-circuit state). For example, when the resistance value 8R is obtained by combining resistance values, the resistance element RE4 (8R) is selected, and the control signal S<1:4> is equal to 0001. In addition, when the resistance value 6R (6R=2R+4R) is obtained by combining resistance values, the resistance elements RE2 (2R) and RE3 (4R) are selected, and the control signal S<1:4> is equal to 0110.

1.2.2. Gate Signal

The gate signal Gxy will be explained with reference to FIGS. 6A and 6B.

FIG. 6A is a logic calculation circuit synthesizing gate signals in the semiconductor device according to the first embodiment.

FIG. 6B illustrates the relationship between a gate signal and control signals in the semiconductor device according to the first embodiment.

As shown in FIG. 6A, in the present embodiment, two bits of control signals Sx and Sy of four-bit control signal S<1:4> are used to perform NOR operation to synthesize the gate signal Gxy. That is, (/(Sx+Sy))=Gxy. "/" indicates "INVERSE operation". "+" indicates "OR operation". The logic operation circuit for synthesizing the gate signal Gxy may be provided within the variable resistance circuit 19, or within the controller 15, or provided separately from the variable resistance circuit 19 or the controller 15.

FIG. 6B shows the results of the NOR operation which indicates G11=(/(S1+S1)), G22=(/(S2+S2)), G33=(/(S3+S3)), G44=(/(S4+S4)), G12=G21=(/(S1+S2)), G13=G31=(/(S1+S3)), G14=G41=(/(S1+S4)), G23=G32=(/(S2+S3)), G24=G42=(/(S2+S4)), and G34=G43=(/(S3+S4)).

1.3. Operation of Variable Resistance Circuit

The operation of the variable resistance circuit 19 will be explained. The variable resistance circuit 19 is controlled so that if k resistance elements RE (k is a natural number from 1 to n) are short-circuited, all switch transistors ST set in a (k+1) row×(k+1) column matrix will be in the ON state. Specifically, among n+1 switch transistors ST connected in parallel (row 0) that are also connected in series with the resistance element RE, k+1 switch transistors ST are in the ON state. Similarly, among n+1 switch transistors ST that are connected in parallel with the resistance element RE to be short-circuited, k+1 switch transistors ST are in the ON state. In addition, all of the n+1 switch transistors ST that are connected in parallel with the resistance element RE which is not to be short-circuited are in the OFF state. If the ON resistance of any one of the switch transistors ST is Ron (>resistance value R), the synthesized resistance value of those switch transistors ST being in the ON state is (k+1)×(Ron/(k+1))=Ron. Accordingly, the synthesized resistance value of the plurality of switch transistors ST in the ON state is equal to the ON resistance Ron of one switch transistor ST regardless of the number of resistance elements RE which are short-circuited.

Two specific examples will be explained below.

1.3.1. First Specific Example

In the first specific example, the case when the synthesized resistance of the resistance elements RE is 8R will be explained with reference to FIG. 7 and FIG. 8.

Figure 7:
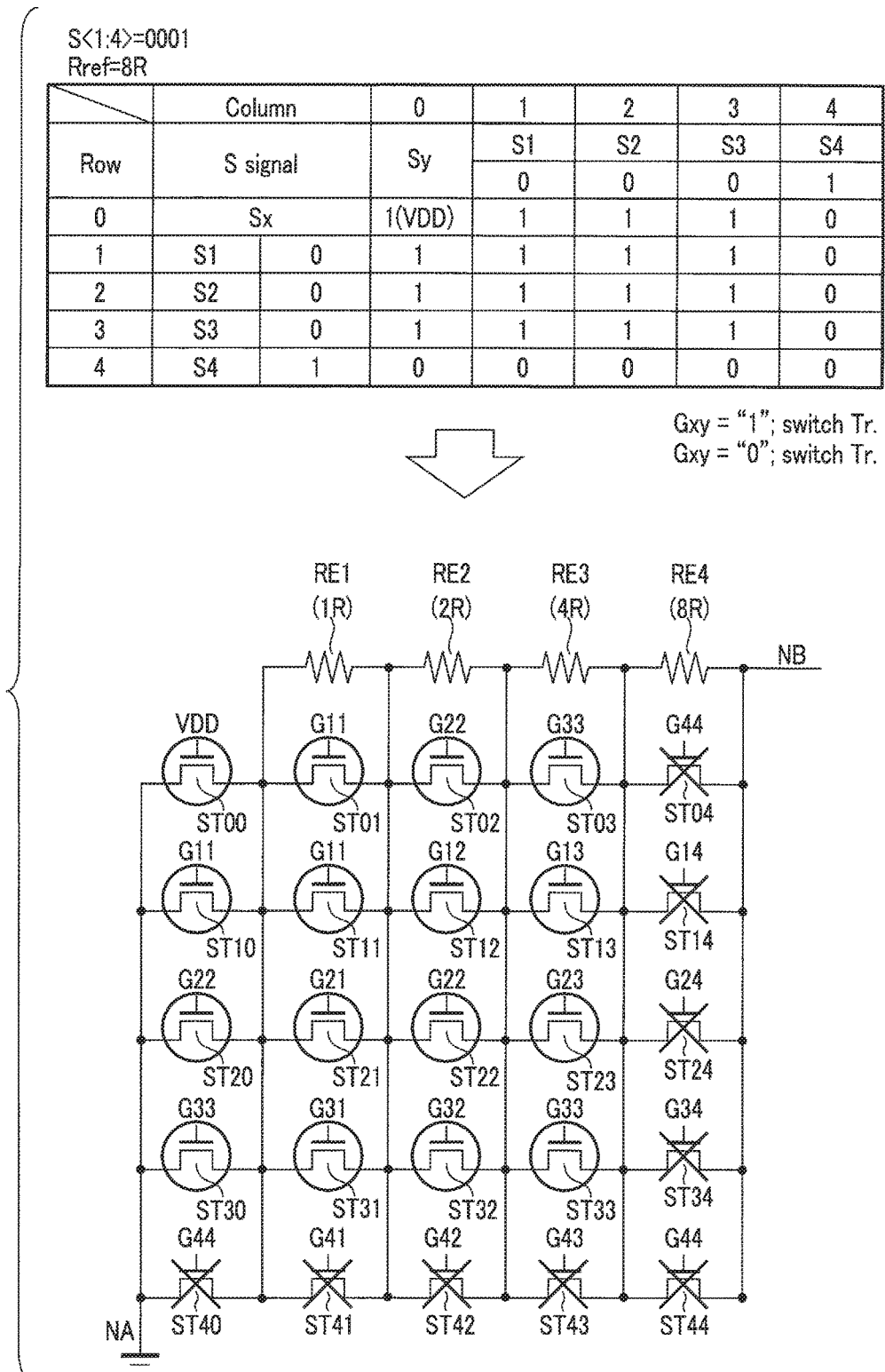
FIG. 7 illustrates the relationships between a control signal, a gate signal, and a switch transistor in the semiconductor device according to the first embodiment in a first example.

FIG. 7 illustrates the relationships between control signals, gate signals, and switch transistors in the semiconductor device according to the first embodiment in the first example.

Figure 8:
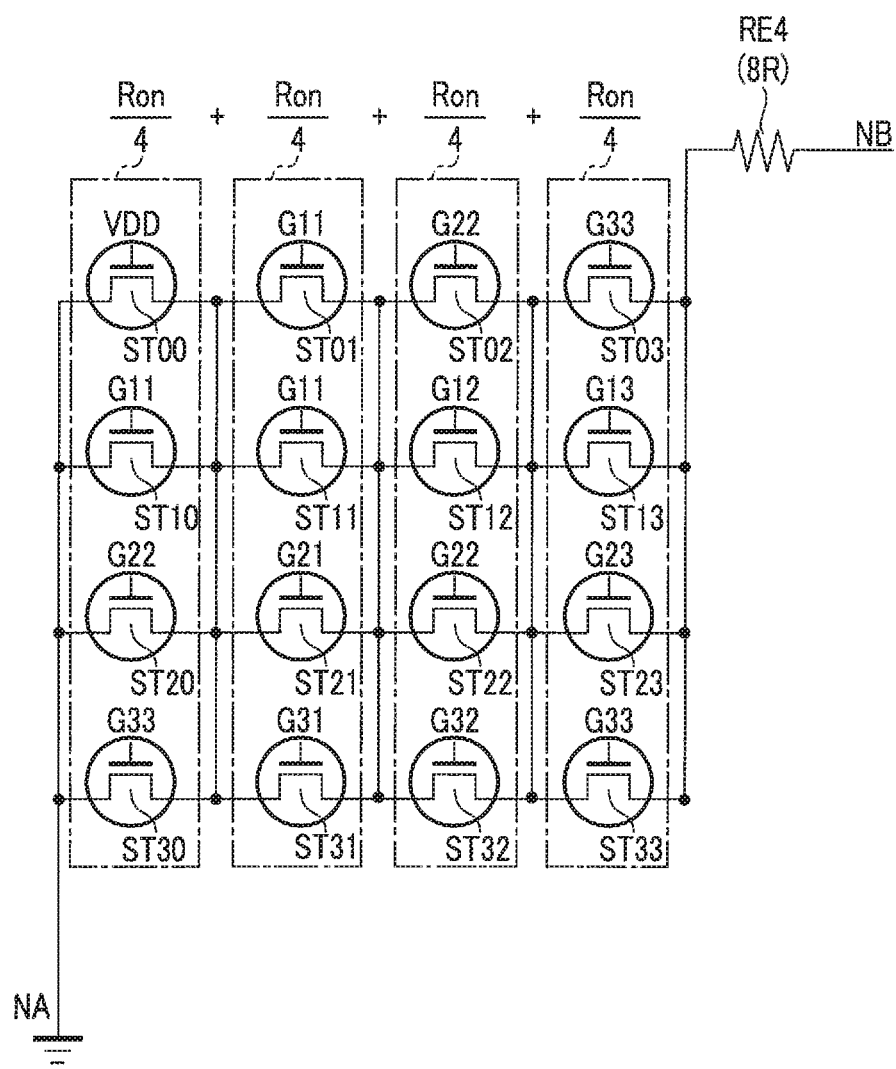
FIG. 8 is a circuit diagram of a simplified structure of a variable resistance circuit in the semiconductor device according to the first embodiment in the first example.

FIG. 8 is a simplified circuit diagram of the variable resistance circuit in the semiconductor device according to the first embodiment in the first example.

A table at the top of FIG. 7 illustrates the relationship between control signals Sx and Sy and a gate signal Gxy of each switch transistor ST. Data "1" of a gate signal Gxy indicates that a switch transistor ST is in the ON state, and data "0" indicates that a switch transistor ST is in the OFF state.

When a resistance value of 8R is synthesized by variable resistance circuit 19, the control signal S<1:4> is 0001. Accordingly, gate signals G14, G24, F34, and G41 to G44 of all switch transistors ST in row 4 (x=a=4), and all switch transistors ST in column 4 (y=b=4) corresponding to the control signal S4=1 are set to data "0", and the gate signals Gxy of the other switch transistors ST are set to data "1".

As a result, as shown in the circuit diagram of FIG. 7, the switch transistors ST04, ST14, ST24, ST34, and ST40 to ST44 are in the OFF state ("X" on the transistor in FIG. 7), and the other switch transistors ST are in the ON state ("O" on the transistor in FIG. 7). In this case, the resistance elements RE1 to RE3 can be mostly ignored and a current path between a node NB and a node NA is formed, since the switch transistors ST connected in parallel are in the ON state.

As shown in FIG. 8, in that case described in FIG. 7 the variable resistance circuit 19 is equal to the state where the resistance element RE4 and the switch transistors ST set in 4×4 matrixes are connected in series while all the transistors are in the ON state. If the ON resistance of the switch transistor ST is Ron, the synthesized resistance value of four switch transistors ST connected in parallel is Ron/4, and the synthesized resistance value of switch transistors ST set in 4×4 matrix is 4×(Ron/4)=Ron. Therefore, the resistance value is the same as ON resistance Ron of one switch transistor ST. Accordingly, the combined resistance of the variable resistance circuit 19 is 8R+Ron.

1.3.2. Second Specific Example

In the second specific example, the case a resistance value of 6R synthesized by the resistance elements RE will be explained with reference to FIGS. 9 and 10.

Figure 9:
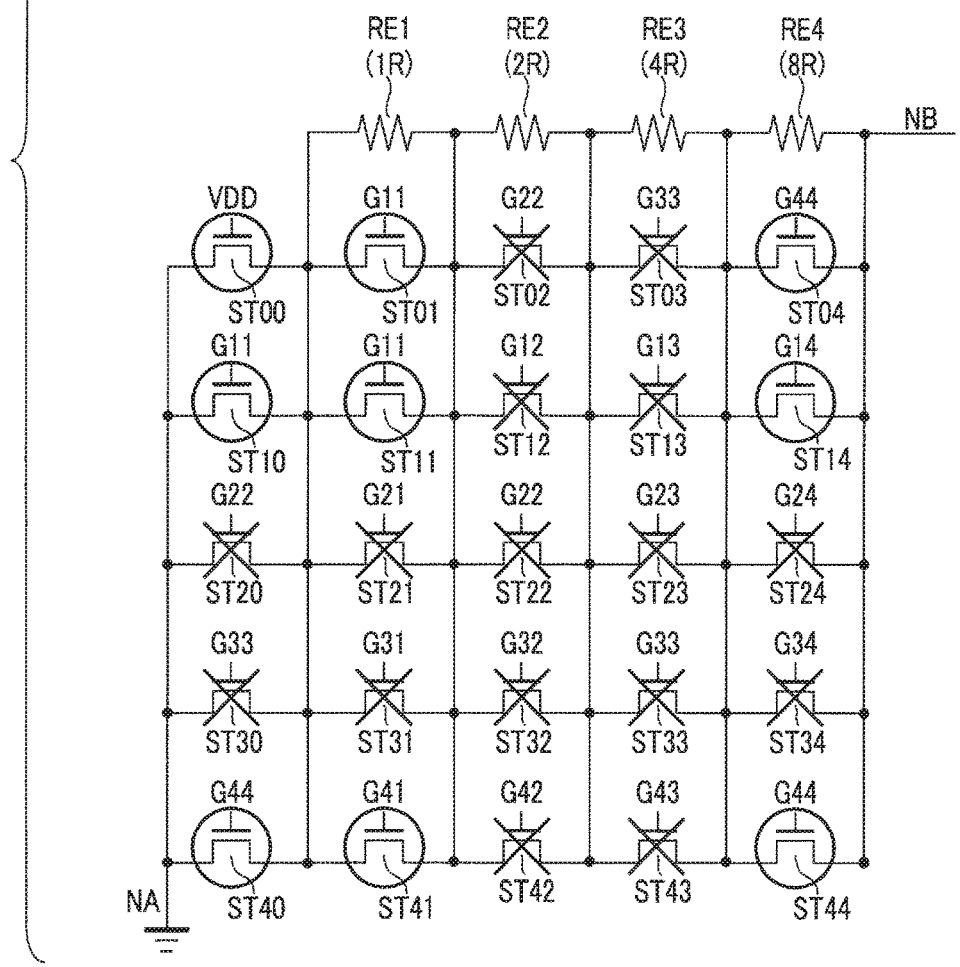
FIG. 9 illustrates the relationships between a control signal, a gate signal, and a switch transistor in the semiconductor device according to the first embodiment in a second example.

FIG. 9 illustrates the relationships between a control signals, gate signals, and switch transistors in the semiconductor device according to the first embodiment in the second example.

Figure 10:
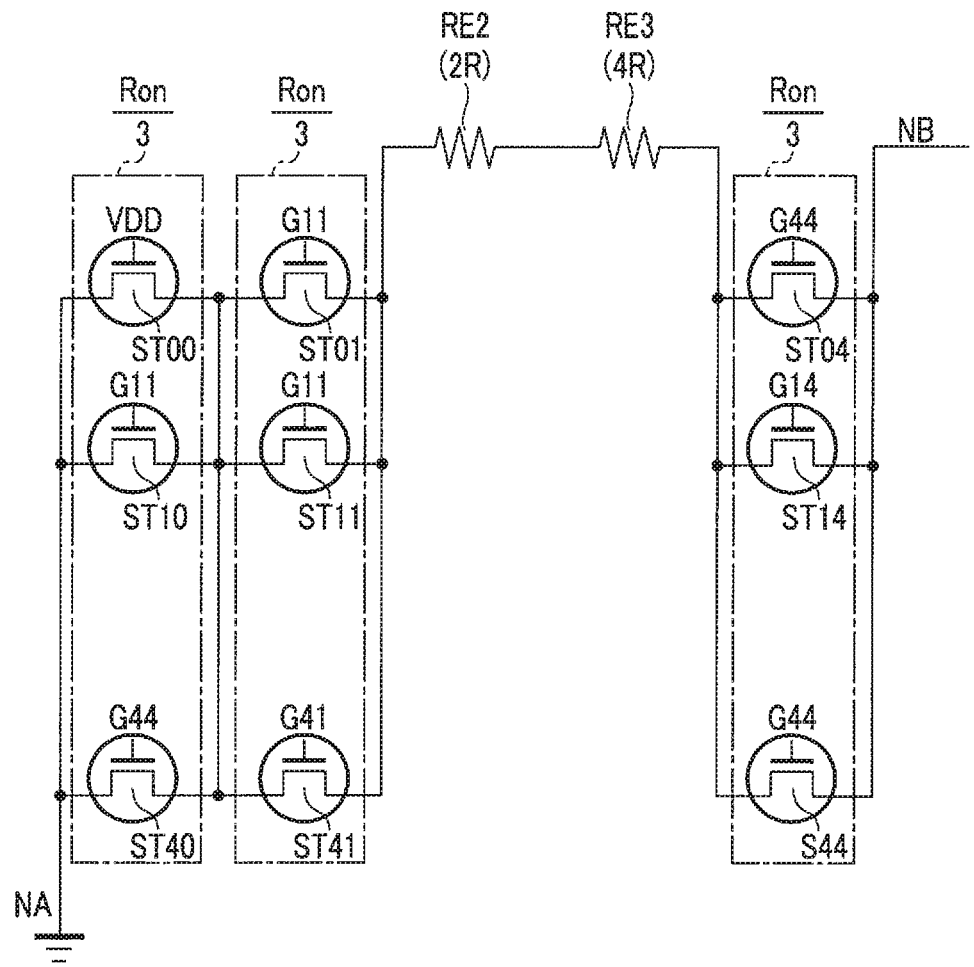
FIG. 10 is a circuit diagram of a simplified structure of a variable resistance circuit in the semiconductor device according to the first embodiment in the second example.

FIG. 10 is a simplified circuit diagram of a variable resistance circuit in the semiconductor device according to the first embodiment in the second example.

As shown in FIG. 9, when a resistance value of 6R is synthesized by the variable resistance circuit 19, the control signal S<1:4> is 0110. Accordingly, gate signals G12, G13, G21 to G24, G31 to G34, G42, and G43, all switch transistors ST in row 2 (x=a=2) and row 3 (x=a=3), and all switch transistors ST in column 2 (y=b=2) and column 3 (y=b=3) corresponding to the control signal S2=S3=1 are set to data "0", and the gate signals Gxy of the other switch transistors ST are set to data "1".

As a result, as shown in the circuit diagram of FIG. 9, the switch transistors ST02, ST03, ST12, ST13, ST20 to ST24, ST30 to ST34, ST42, and ST43 are in the OFF state, and the other switch transistors ST are in the ON state. In this case, the resistance elements RE1 and RE4 can be mostly ignored and a current path between the node NB and the node NA is formed, since the switch transistors ST connected in parallel are in the ON state.

As shown in FIG. 10, the variable resistance circuit 19 is equal to the state where the resistance elements RE2 and RE3 and the switch transistors ST set in 3×3 matrix being in the ON state are connected in series. Since the resistance value of three switch transistors ST connected in parallel is Ron/3, the resistance value of switch transistors ST set in 3×3 matrix is 3×(Ron/3)=Ron. Accordingly, the synthesized resistance of the variable resistance circuit 19 is 6R+Ron.

1.4. Advantageous Effects of Present Embodiment

The configuration of the present embodiment can improve reliability as explained below.

The memory elements (e.g., MTJ elements) vary in property (resistance value) due to manufacturing variations, for example. Accordingly, in many cases a variable resistance circuit is adopted as a reference resistance element so that an optimal resistance value can be set after being manufactured.

A circuit in which, for example, a plurality of configurations connected in series and each of which includes a resistance element and a switch transistor connected in parallel, is used as a variable resistance circuit. In such circuit, a plurality of switch transistors are used to selectively short-circuit an unnecessary resistance element in order to combine a required resistance value. Note that a combined resistance value, (the number of switch transistors in the ON state)×(ON resistance of switch transistors), is included in a reference resistance Rref, in accordance with the number of switch transistors in the ON state (short-circuit state). Accordingly, the variance from a target value (a resistance value designated to be synthesized by using resistance elements) varies in accordance with a set value of the variable resistance circuit (the number of resistance elements to be short-circuited), namely, the number of switch transistors to be in the ON state.

For example, if a greater number of switch transistors are to be in the ON state, the synthesized resistance value due to ON resistance becomes greater. In this case, the reference resistance Rref greatly differs from the target value. As a result, the difference from the memory element's resistance value to the reference resistance value becomes smaller, which may lead to an incorrect reading.

On the other hand, according to the present embodiment configuration of the variable resistance circuit 19 includes (n+1) switch transistors ST connected in parallel, n resistance elements RE which are connected in series with the switch transistors ST, and (n+1) switch transistors ST each connected to the corresponding resistance element RE in parallel. In addition, regardless of the number of resistance elements RE to be short-circuited, the number of switch transistors ST in the ON state to be connected in parallel is set to be equal to the number of switch transistors ST in the ON state to be connected in series.

With this configuration, the synthesized ON-state resistance value of a plurality of switch transistors ST can be almost the same as the ON resistance Ron of one switch transistor ST, regardless of the set value of the variable resistance circuit 19 (the number of resistance elements RE to be short-circuited). Accordingly, the variance in the synthesized resistance value of ON resistance in accordance with the number of switch transistors ST in the ON state can be suppressed, and the linearity of resistance value of the variable resistance circuit 19 relative to the set value can be improved. As a result, a failure in reading can be suppressed, and thereby the reliability of read data can be improved.

With the configuration according to the embodiment, even if the ON resistance Ron of a switch transistor varies due to environmental dependency (temperature changes), the variance of synthesized resistance by the ON resistance of a plurality of switch transistors ST can be almost the same as variance of ON resistance Ron of one switch transistor ST. Accordingly, the change in resistance value due to temperature change can be suppressed.

In addition, with the configuration according to the embodiment, leak current due to a switch transistor ST in the OFF state can be suppressed.

For example, a circuit in which a plurality of configurations connected in series, each of which includes a resistance element and a switch transistor connected in parallel, is applied as a variable resistance circuit. In such a circuit, reducing ON resistance of a switch transistor by enlarging the transistor size is adaptive as one of the methods for suppressing variance in synthesized resistance value by the plurality of switch transistors in the ON state. However, as the transistor size becomes larger, the leak current increases when the switch transistor is in the OFF state. Thus, the variance in synthesized resistance value becomes greater due to the leak current. Accordingly, it is unlikely that a sufficient effect to suppress the variance in synthesized resistance value is obtained due to the greater leak current, even if the ON resistance of the switch transistor decreases while expanding the transistor size.

On the other hand, with the configuration according to the embodiment, the variance of synthesized resistance value by the plurality of switch transistors ST in the ON state can be suppressed, while there is no need to expand the transistor size. Therefore, the increase of leak current along with the increase of the transistor size can be suppressed.

2. Second Embodiment

A semiconductor device according to the second embodiment is explained below. The second embodiment is different from the first embodiment that the gate signal Gxy is synthesized by an AND operation. Hereinafter, only the matters that are different from the first embodiment will be explained.

2.1. Combination of Control Signals

First, a four-bit control signal S<1:4> will be explained in detail with reference to FIG. 11.

FIG. 11 is a table illustrating the relationship between control signals and a combined resistance value of the resistance elements in the semiconductor device according to the second embodiment.

As shown in FIG. 11, data "1" indicates the case where a corresponding resistance element RE is unselected, i.e., the corresponding switch transistor ST is in an ON state in this embodiment. Data "0" indicates the case where a corresponding resistance element RE is selected, i.e., the corresponding switch transistor ST is in an OFF state. For example, when the resistance value 8R is obtained by combining resistance values, the control signal S<1:4> is 1110. When the resistance value 6R is obtained by combining resistance values, the control signal S<1:4> is 1001.

2.2. Gate Signal

The gate signal Gxy will be explained with reference to FIGS. 12A and 12B.

Figures 12A, 12B:
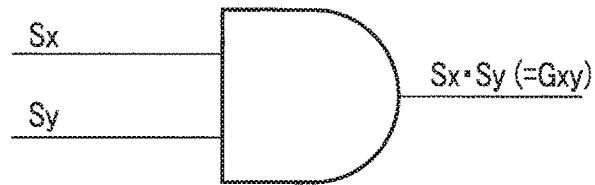
FIG. 12A is a logic calculation circuit indicating a combination of gate signals in the semiconductor device according to the second embodiment.
FIG. 12B illustrates the relationship between a gate signal and a control signal in the semiconductor device according to the second embodiment.

FIG. 12A is a logic calculation circuit of gate signals in the semiconductor device according to the second embodiment.

FIG. 12B illustrates the relationship between gate signals and control signals in the semiconductor device according to the second embodiment.

As shown in FIG. 12A, in the present embodiment, two bits of control signals Sx and Sy which correspond to four-bit control signal S<1:4> in FIG. 12B are used to synthesize the gate signal Gxy by AND logic calculation. That is, /(Sx·Sy)=Gxy. "·" indicates "AND operation". Besides, NAND logic circuit is also available while inverter logic circuit is required after the NAND circuit to perform a AND logic calculation.

FIG. 12B shows the results of the AND calculation which indicates G11, G22, G33, G44, G12=G21, G13=G31, G14=G41, G23=G32, G24=G42, and G34=G43, similar to the first embodiment.

2.3. Operation Example of Variable Resistance Circuit

The case when the synthesized resistance of the resistance elements RE is 8R will be explained with reference to FIG. 13.

FIG. 13 is a table illustrating the relationship between control signals and gate signals in the semiconductor device according to the second embodiment.

As shown in FIG. 13, when the variable resistance circuit 19 synthesizes the resistance value 8R, the control signal S<1:4> is 1110. In this case, the gate signal Gxy of each switch transistor shows the same ON-OFF operation as illustrated in the table in FIG. 7. That is, gate signals G14, G24, G34, and G41 to G44 of all switch transistors ST in row 4 (x=a=4), and all switch transistors ST in column 4 (y=b=4) corresponding to the control signal S4=0 are set to data "0", and the gate signals Gxy of the other switch transistors ST are set to data "1".

2.4. Advantageous Effects of Present Embodiment

The second embodiment can provide the same effect as the first embodiment.

3. Third Embodiment

A semiconductor device according to the third embodiment is explained below. The third embodiment adopts the variable resistance circuit 19 explained in the first embodiment to the internal voltage generator 18. In the following, only the matters different from the first embodiment will be explained. In this embodiment, it is possible to adopt the variable resistance circuit 19 of the first embodiment to the reference resistance element in the internal voltage generator 18.

3.1. Configuration of Internal Voltage Generator

First, the configuration of the internal voltage generator will be explained with reference to FIG. 14.

FIG. 14 is a circuit diagram of an internal voltage generator in the semiconductor device according to the third embodiment.

As shown in FIG. 14, the internal voltage generator 18 includes an operational amplifier AMP1, a p-channel MOS transistor Tvg, the variable resistance circuit 19, and a resistance element REvg.

The operational amplifier AMP1 receives voltage V1a at a non-inverse input terminal, and receives voltage V1b of node NC at an inverse input terminal. The output terminal of the operational amplifier AMP1 is connected to the gate of the transistor Tvg. The voltage V1a is, for example, a voltage input from a band gap reference (BGR) circuit (not shown in the drawings). The operational amplifier AMP1 controls a voltage to be applied to the gate of the transistor Tvg so that the voltage V1b of the node NC is equal to the voltage V1a.

The transistor Tvg receives a voltage VDD at one end (i.e., being connected to a power supply voltage line to which a voltage VDD is applied), and is connected to the node ND at the other end.

The variable resistance circuit 19 is connected to the node ND at one end, and connected to a node NC at the other end.

The resistance element REvg is connected to the node NC at one end, and grounded at the other end.

The internal voltage generator 18 having the aforementioned configuration outputs a voltage of the node ND as an output voltage Vout.

If the resistance value of the resistance element REvg is Ra, and the resistance value of the variable resistance circuit 19 is Rb, the output voltage exhibits Vout=(V1a)×(Rb+Ra)/Ra. Therefore, the internal voltage generator 18 generates a required voltage by controlling the resistance value of the variable resistance circuit 19.

3.2. Advantageous Effects of Present Embodiment

The configuration of the present embodiment can improve linearity of an actual resistance value Rb relative to the set value of the variable resistance circuit 19. In addition, according to the number of switch transistors in the ON state, variations in temperature dependency of a switch transistor ST in the variable resistance circuit 19 can be suppressed. Accordingly, the voltage can be controlled more accurately in the internal voltage generator 18. This configuration accomplishes stable voltage supply, and stable circuit operation of the semiconductor device, thereby improving the reliability.

4. Examples of Variations

The semiconductor device according to the embodiment includes a variable resistance circuit (19 in FIGS. 2 and 4) including first and second resistance elements (RE1 and RE2 in FIG. 4) connected in series; first and second switch elements (ST11 and ST21 in FIG. 4) each connected in parallel with the first resistance element; and third and fourth switch elements (ST12 and ST22 in FIG. 4) each connected in parallel with the second resistance element. In a case where the first resistance element is short-circuited, and the second resistance element is not short-circuited, one of the first and second switch elements is in an ON state and other of the first and second switch elements, the third switch element, and the fourth switch element are in an OFF state. In a case where the second resistance element is short-circuited, and the first resistance element is not short-circuited, one of the third and fourth switch elements is in the ON state and the first element, the second element, and other of the third and fourth switch elements are in the OFF state. In a case where the first and second resistance elements are short-circuited, the first to fourth switch elements are in the ON state. In a case where the first and second resistance elements are not short-circuited, the first to fourth switch elements are in the OFF state.

By applying the above embodiment, it is possible to provide a semiconductor device that can improve the reliability. Note that the embodiments are not limited to the above-explained aspects, and different variations are possible.

In addition, in the embodiments, the required resistance value of resistance elements RE1 to RE4 of the variable resistance circuit 19 may be set by one corresponding resistance element, and also may be set by combining a plurality of resistance elements in series or in parallel. For example, in a case when the resistance value of the resistance element RE1 is designed to be 1R, and the resistance value of the resistance element RE4 is 8R, the resistance element RE1 may be replaced by eight resistance elements RE4 connected in parallel.

The above embodiments explained the variable resistance circuit 19 including (n+1) switch transistors ST connected in parallel, n resistance elements RE connected in series with the switch transistors ST, and (n+1) switch transistors ST each connected to the corresponding resistance element RE in parallel; however, (n+1) switch transistors ST connected in parallel with each other that are connected in series with the resistance elements RE may be omitted. In addition, the number of switch transistors ST that are connected in parallel with the resistance element RE may be n or more. Accordingly, the synthesized resistance value by the ON resistance of switch transistors ST may be changed.

Furthermore, some of resistance elements RE1 to RE4 may have same resistance value for each.

Furthermore, in the above embodiment, the sense amplifier unit 20 may be replaced by a voltage sensing type.

Note that according to all above embodiments, the applied memory device (MRAM as described above) may be a spin-transfer torque magnetoresistive random access memory (STT-MRAM) utilizing spin injection phenomenon for magnetization inversion of a magnetic layer.

In each of the above embodiments, as a semiconductor device, an MRAM using a magnetoresistive effect element is explained as an example, but is not limited thereto. The embodiments can be applied to the semiconductor device for storing or reading the data using the memory element which varies its resistance value by applying a necessary current (or voltage). The embodiments can be applied to a resistance change type memory similar to an MRAM, such as a ReRAM (resistive random access memory) and a PCRAM (phase-change random access memory). The embodiments also can be applied to a semiconductor device using a variable resistance circuit.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a variable resistance circuit including a first circuit which includes a first resistance element and first and second switch elements each connected in parallel with the first resistance element, and a second circuit which includes a second resistance element and third and fourth switch elements each connected in parallel with the second resistance element, the first circuit being connecting in series with the second circuit,
wherein:
when the first resistance element is short-circuited, and the second resistance element is not short-circuited, one of the first and second switch elements is in an ON state and the other of the first and second switch elements, the third switch element, and the fourth switch element are in an OFF state,
when the second resistance element is short-circuited, and the first resistance element is not short-circuited, one of the third and fourth switch elements is in the ON state and the first switch element, the second switch element, and the other of the third and fourth switch elements are in the OFF state,
when the first and second resistance elements are both short-circuited, the first to fourth switch elements are in the ON state, and
when the first and second resistance elements are not short-circuited, the first to fourth switch elements are in the OFF state.

2. The device according to claim 1, wherein:
the first circuit further includes a fifth switch element connected in parallel with the first resistance element,
the second circuit further includes a sixth switch element connected in parallel with the second resistance element,
the variable resistance circuit further includes a third circuit which includes seventh to ninth switch elements connected in parallel, the third circuit being connecting in series with the first and second circuits,
when the first resistance element is short-circuited, and the second resistance element is not short-circuited, the fifth switch element and two of the seventh to ninth switch elements are in the ON state and the sixth switch element and another of the seventh to ninth switch elements are in the OFF state,
when the second resistance element is short-circuited, and the first resistance element is not short-circuited, the sixth switch element and two of the seventh to ninth switch elements are in the ON state and the fifth switch element and another of the seventh to ninth switch elements are in the OFF state,
when the first and second resistance elements are both short-circuited, the fifth to ninth switch elements are in the ON state, and
when the first and second resistance elements are not short-circuited, one of the seventh to ninth switch elements is in the ON state and the fifth switch element, the sixth switch element, and the others of the seventh to ninth switch elements are in the OFF state.

3. The device according to claim 1, wherein the first to fourth switch elements are MOS transistors.

4. The device according to claim 3, wherein the MOS transistors have approximately a same size.

5. The device according to claim 1, wherein the first and second resistance elements are different in resistance value.

6. The device according to claim 1, wherein the first and second resistance elements comprise diffusion layer resistance.

7. The device according to claim 1, wherein the first and second resistance elements each includes a semiconductor layer provided on a semiconductor substrate via an insulation layer.

8. The device according to claim 1, wherein the first and second resistance elements each includes first and second magnetic layers, and an insulation layer provided between the first and second magnetic layers.

9. The device according to claim 1, wherein the first and second resistance elements are MTJ elements.

10. The device according to claim 1, further comprising:
a memory cell including a variable resistance element; and
a sense amplifier in which the memory cell is connected to a first input terminal, and the variable resistance circuit is connected to a second input terminal.

11. The device according to claim 10, wherein the memory cell holds different data in a case where the memory cell is in a high resistance state, and in a case where the memory cell is in a low resistance state.

12. The device according to claim 10, wherein the variable resistance element is an MTJ element.

13. The device according to claim 10, wherein a resistance value of the variable resistance circuit is set to a value between a high resistance value and a low resistance value of the memory cell.

14. A semiconductor device comprising:
a variable resistance circuit including: a first circuit which includes N+1 (N is a natural number equal to or greater than two) first switch elements connected in parallel, and N second circuits each of which includes a resistance element and N+1 second switch elements each connected in parallel with the resistance element, wherein the N second circuits are connected in series, and the first circuit is connected in series to the N second circuits,
wherein, when K resistance elements (K is an integer which is greater than or equal to 0 and less than or equal to N) of K second circuits are short-circuited:
K+1 first switch elements in the first circuit are in an ON state,
K+1 second switch elements in each of the K second circuits are in the ON state, and
the N+1 second switch elements in each of the other second circuits are in an OFF state.

15. The device according to claim 14, wherein the N+1 first switch elements and the N+1 second switch elements included in each of the N second circuits are MOS transistors.

16. The device according to claim 14, wherein at least one of the N+1 first switch elements is in the ON state regardless of a number of the resistance elements to be short-circuited.

17. The device according to claim 14, wherein the resistance elements each includes first and second magnetic layers, and an insulation layer provided between the first and second magnetic layers.

18. The device according to claim 14, wherein the resistance elements are MTJ elements.

19. A semiconductor memory device, comprising:
a memory cell including a variable resistance element;
a variable resistance circuit including a first circuit which includes a first resistance element and first and second switch elements each connected in parallel with the first resistance element, and a second circuit which includes a second resistance element and third and fourth switch elements each connected in parallel with the second resistance element, the first circuit being connecting in series with the second circuit; and
a sense amplifier in which the memory cell is connected to a first input terminal, and the variable resistance circuit is connected to a second input terminal.

20. The device according to claim 19, wherein the variable resistance element is an MTJ element.

* * * * *